(12) United States Patent
Refai-Ahmed et al.

(10) Patent No.: US 12,324,101 B2
(45) Date of Patent: Jun. 3, 2025

(54) FRAME FOR COUPLING OF A THERMAL MANAGEMENT DEVICE TO A PRINTED CIRCUIT BOARD

(71) Applicant: Advanced Micro Devices, Inc., Santa Clara, CA (US)

(72) Inventors: Gamal Refai-Ahmed, Santa Clara, CA (US); Suresh Ramalingam, Fremont, CA (US); Aslam Yehia, San Jose, CA (US); Chi-Yi Chao, New Taipei (TW); Md Malekkul Islam, San Jose, CA (US); Hoa Do, San Jose, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 274 days.

(21) Appl. No.: 18/121,487

(22) Filed: Mar. 14, 2023

(65) Prior Publication Data

US 2024/0314934 A1 Sep. 19, 2024

(51) Int. Cl.
*H05K 1/18* (2006.01)
*H05K 5/00* (2006.01)
*H05K 7/10* (2006.01)
*H05K 7/20* (2006.01)

(52) U.S. Cl.
CPC ........... *H05K 1/181* (2013.01); *H05K 5/0026* (2013.01); *H05K 7/10* (2013.01); *H05K 7/20836* (2013.01)

(58) Field of Classification Search
CPC .... H05K 1/18; H05K 1/181–187; H05K 5/00; H05K 5/0026; H05K 5/0043; H05K 7/10; H05K 7/20; H05K 7/20836

USPC ........ 361/693, 696–697, 700–714, 770, 790; 257/686, 720–725

See application file for complete search history.

(56) References Cited

U.S. PATENT DOCUMENTS

| | | | | |
|---|---|---|---|---|
| 5,182,632 A | * | 1/1993 | Bechtel | H01L 23/3675 257/713 |
| 6,208,526 B1 | * | 3/2001 | Griffin | H05K 1/142 361/764 |
| 8,034,661 B2 | * | 10/2011 | Lin | H01L 23/552 257/E21.503 |
| 8,344,489 B2 | * | 1/2013 | Saitoh | B81C 3/005 257/E23.181 |
| 9,089,052 B2 | * | 7/2015 | Li | H01L 25/0655 |
| 2002/0057554 A1 | * | 5/2002 | Dibene, II | G06F 1/182 361/720 |

(Continued)

OTHER PUBLICATIONS

U.S. Appl. No. 17/688,803, filed Mar. 7, 2022, Entiteled "Chip Package With Decoupled Thermal Management".

*Primary Examiner* — Tuan T Dinh
(74) *Attorney, Agent, or Firm* — Patterson + Sheridan, LLP

(57) ABSTRACT

An electronic device having a frame for coupling a plurality of thermal management devices to the printed circuit board is provided. The electronic device includes a first chip package mounted to the PCB and a second chip package mounted to the PCB. The frame is secured to the PCB, and the frame has a first aperture disposed over the first chip package and a second aperture disposed over the second chip package. The plurality of thermal management devices coupled to the frame includes a first thermal management device contacting an IC die of the first chip package through the first aperture and a second thermal management device contacting an IC die of the second chip package through the second aperture.

20 Claims, 10 Drawing Sheets

(56) References Cited

U.S. PATENT DOCUMENTS

2014/0151871 A1\* 6/2014 Refai-Ahmed ..... H01L 23/3675
                                                    165/185

\* cited by examiner

FRAME FOR COUPLING OF A THERMAL MANAGEMENT DEVICE TO A PRINTED CIRCUIT BOARD

TECHNICAL FIELD

Embodiments of the present invention generally relate to micro devices having a frame for coupling of a thermal management device to printed circuit board.

BACKGROUND

Micro devices, such as electronic devices, photonic devices, microelectromechanical systems (MEMS) and/or RF devices, often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices. These micro devices containing one or more chip packages are frequently utilized in advanced electronic computing systems, such as found in telecomm and datacomm equipment, cellular antennas, data centers and automotive electronics, among others.

In many chip package assemblies, providing adequate thermal management has become increasingly challenging. Failure to provide adequate cooling often results in diminished service life and even device failure. Thermal management is particularly problematic in applications where active components have high current and power usage, and correspondingly generate high heat loads. Where micro devices include multiple active components, it is challenging to mount those multiple thermal management devices, especially since the area on a printed circuit board is limited.

Therefore, a need exists for a micro device having improved thermal management.

SUMMARY

In one example, an electronic device having a frame for coupling a plurality of thermal management devices to the printed circuit board is provided. The electronic device includes a first chip package mounted to the PCB and a second chip package mounted to the PCB. The frame is secured to the PCB, and the frame has a first aperture disposed over the first chip package and a second aperture disposed over the second chip package. The plurality of thermal management devices coupled to the frame includes a first thermal management device contacting an IC die of the first chip package through the first aperture and a second thermal management device contacting an IC die of the second chip package through the second aperture.

In another example, an electronic device having a frame for coupling a plurality of thermal management devices to the printed circuit board is provided. The electronic device includes a first chip package mounted to the PCB and a second chip package mounted to the PCB. The frame is secured to the PCB, and the frame has a first aperture and a second aperture. The plurality of thermal management devices coupled to the frame includes a first thermal management device in thermal contact with an IC die of the first chip package through the first aperture, a second thermal management device in thermal contact with an IC die of the second chip package through the second aperture, and a third thermal management device having a first opening and a second opening aligned with the first aperture and the second aperture, respectively.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
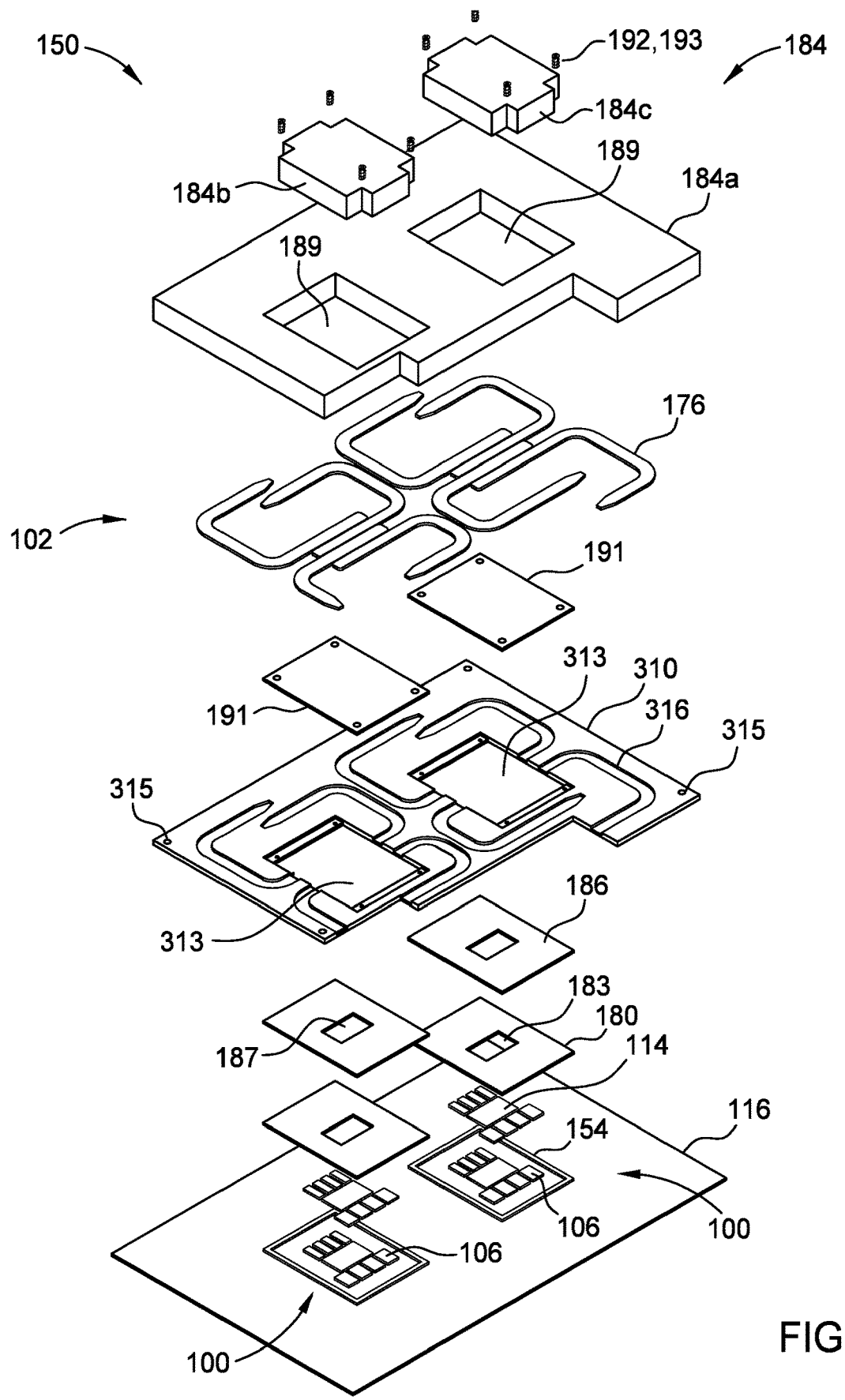
FIG. 1 is an exploded view of a micro device utilizing a frame to interface a plurality of heat management devices to the printed circuit board, according to some embodiments.

To facilitate understanding, identical reference numerals have been used, where possible, to designate identical elements that are common to the figures. It is contemplated that elements of one embodiment may be beneficially incorporated in other embodiments. Additionally, the adjectives top and bottom are provided for ease of explanation, and may be utilized to desired surfaces that alternatively may have a vertical orientation.

DETAILED DESCRIPTION

Micro devices having a frame for coupling a thermal management device are provided. Example of micro devices include, without limitation, electronic devices, photonic devices, microelectromechanical systems (MEMS) and/or RF devices. The micro devices described herein utilize a frame attached to the printed circuit board (PCB) for coupling one or more thermal management devices to the PCB. The frame allows the one or more thermal management devices to be coupled to the PCB without direct attachment to the PCB. This is particularly advantageous since multiple thermal management devices may be employed without increasing the footprint on the PCB, since the frame is independently attached to the PCB.

Turning now to FIG. 1, an exploded view of a micro device 150 having a plurality of chip packages 100 mounted to a printed circuit board (PCB) 116, according to some embodiments. The micro device 150 additionally includes a frame 310 attached to the PCB 116, and a plurality of thermal management devices 102 coupled to the frame 310.

The thermal management devices 102 function to transfer heat from the chip packages 100.

In FIG. 1, the micro device 150 includes two chip packages 100 mounted to the printed circuit board 116. Although two chip packages 100 are shown, one, three, four, or more chip packages 100 may be mounted to the printed circuit board 116. The chip packages 100 may be configured as a silicon device, a MEMS device, a photonic device, an RF device, or combinations thereof.

Figure 2:
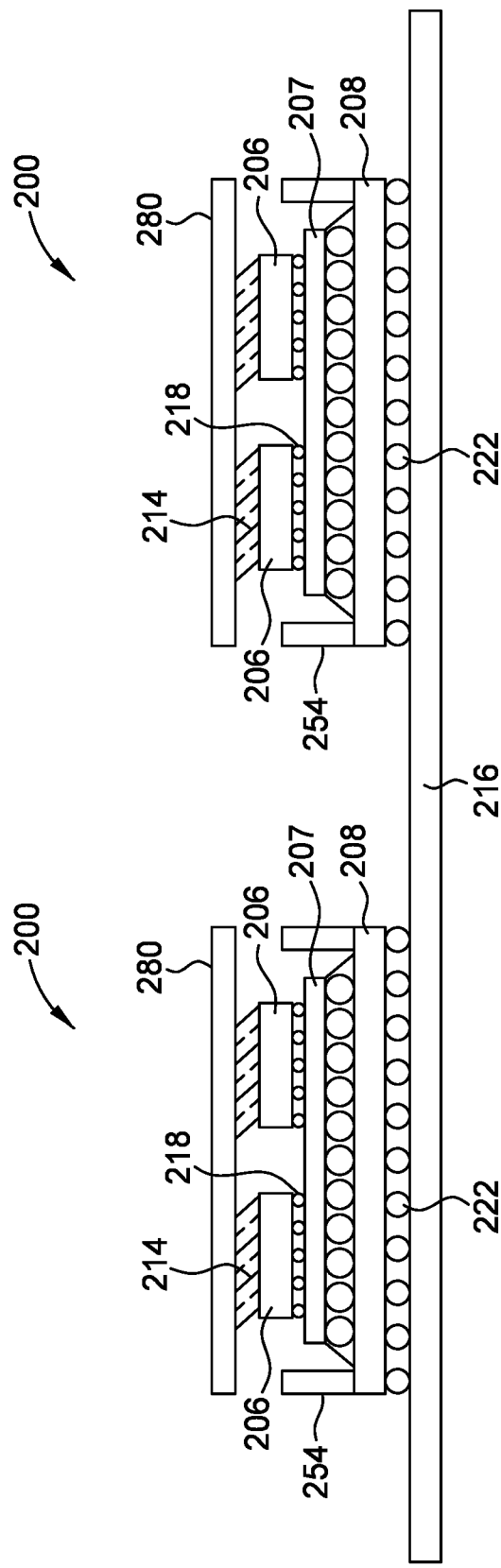
FIG. 2 is a schematic sectional view of an exemplary embodiment of chip packages suitable for use with the micro device of FIG. 1, according some embodiments.

FIG. 2 illustrates an exemplary embodiment of chip packages 200 suitable for use as the chip packages 100 of the micro device 150 shown in FIG. 1. Each chip package 200 includes one or more integrated circuit (IC) dies 206 and a package substrate 208. In this example, two integrated circuit dies 206 are electrically and mechanically mounted to the package substrate 208. Optionally, the integrated circuit dies 206 may be electrically and mechanically mounted to an interposer 207, with the interposer 207 electrically and mechanically mounted to the package substrate 208. The package substrate 208 of the chip package 200 is mounted to the PCB 216 to form at least a portion of the micro device, such as micro device 150. In some embodiments, each chip package 200 may have the same or different number of IC dies 206. Each chip package may include any suitable number of IC dies 206 that may fit on the PCB 216, such as three, six, or nine IC dies. Examples of IC dies 206 that may be utilized in the chip package 200 include, but are not limited to, logic and memory devices, such as field programmable gate arrays (FPGA), application-specific integrated circuits (ASICs), memory devices, such as high band-width memory (HBM), optical devices, processors or other IC logic or memory structures. One or more of the IC dies 206 may optionally include optical devices such as photo-detectors, lasers, optical sources, and the like.

Functional circuitry of the IC dies 206 is connected to the circuitry of the package substrate 208 through the solder connections 218 or other suitable electrical connection, such as a hybrid connecter comprised of metal circuit connection material disposed in a dielectric sheet. A bottom surface of the package substrate 208 is electrically and mechanically coupled to the circuitry of the PCB 216 via solder connections 222 when the chip package 200 is mounted to an upper surface of the PCB 216 to form the micro device, such as micro device 150.

A stiffener 254 may be coupled to the package substrate 208 and circumscribe the IC dies 206. The stiffener 254 can extend to peripheral edges of the package substrate 208 to provide mechanical support, which helps prevent the chip package 200 from bowing and warpage. The stiffener 254 may be a single-layer structure or a multi-layer structure. The stiffener 254 may be made of ceramic, metal, or other various inorganic materials, such as aluminum oxide ($Al_2O_3$), aluminum nitride (AlN), silicon nitride (SiN), silicon (Si), copper (Cu), aluminum (Al), diamond, and stainless steel, among other materials. The stiffener 254 can also be made of organic materials such as copper-clad laminate.

A lid 280 may be disposed over the IC dies 206. In some examples, the lid 280 may be fabricated from a thermally conductive material, such as copper, nickel-plated copper, or aluminum, among other suitable materials. In this respect, the lid 280 functions as a thermal management device, such as thermal management device 102. In some embodiments, the lid 280 may include diamonds, such as on a bottom surface of the lid 280. The lid 280 may have a thickness of between about 0.5 mm and about 3.0 mm, although other thicknesses may be utilized. Additional thermal management devices, either active or passive, may optionally be mounted to the top surface of the lid 280.

Generally, the lid 280 is disposed over the IC dies 206. A thermal interface material (TIM) 214 may be utilized to thermally and/or mechanically couple the lid 280 to the IC dies 206. The TIM 214 may be selected to provide a thermally conductive path between the lid 280 to the IC dies 206 so that heat generated by the IC dies 206 may be dissipated through the lid 280. The TIM 214 is generally a heat transfer material having a conductivity of at least about 0.1 W/m·K and is designed to displace the air that is present in the gaps between the lid 280 and the IC dies 206, thereby decreasing the thermal contact resistance. Examples of materials suitable for use as the TIM 214 include thermal grease, thermally conductive epoxy, phase-change materials (PCMs), conductive tapes, and silicone-coated fabrics among other suitable materials. The TIM 214 may be a soft or compliant adhesive to allow compensation between mismatched heights of neighboring IC dies 206 within the chip package 200. In one example, the TIM 214 may be a thermal gel or thermal epoxy, such as packaging component attach adhesives available from AI Technology, Inc., located in Princeton Junction, New Jersey. The PCM may be manufactured as a blend of hydrocarbon polymers to provide a material that has slight melting, but is mostly an amorphous solid that softens with temperature and does not suddenly change from a solid to a liquid state. One or more of these polymers may contain metal powder and/or ceramic fillers, which may be greater than 90% of the PCM by weight. The fillers may have a maximum particle size of 25 μm. In another example, the TIM 214 may be a phase-change material, such as Tpcm 780 or Tpcm 780SP available from Laird PLC of London, United Kingdom.

Optionally, the bottom surface of the lid 280 may include a patterned surface. The patterned surface may be comprised of dimples, projections, blind holes, slots, channels and the like which increase the surface area of the bottom surface in contact with the TIM 214, which increases the heat transfer efficiency. The patterned surface, in one example, is comprised of a pattern of micro-grooves formed in the bottom surface of the lid 280. The patterned surface may be formed via etching, embossing, or any other suitable technique. For some examples, the patterned surface may be in the form of micro-grooves arranged rows, in columns, as positive-sloping diagonals, as negative-sloping diagonals, or as a combination thereof. In one example, the features (i.e., micro-grooves, protrusions, etc.) forming the patterned surface may have a plus or minus elevation of, but not limited to, 0.1 mm to 0.2 mm relative to the general plane of the bottom surface.

The lid 280 may also be disposed over the stiffener 254. In some implementations, the lid 280 may be bonded to the stiffener 254 by an adhesive (not shown), such as an epoxy. In other implementations, the lid 280 is movably coupled to the stiffener 254. For example, the lid 280 may include a pin that can be inserted into a hole in the stiffener 254. The pin coupling allows the lid 280 to move freely (i.e., "float") relative to the stiffener 254. In this manner, stresses between the lid 280 and the stiffener 254 are mechanically decoupled, resulting in less warpage and delamination of the various layers and components of the chip package 200.

Figure 3:
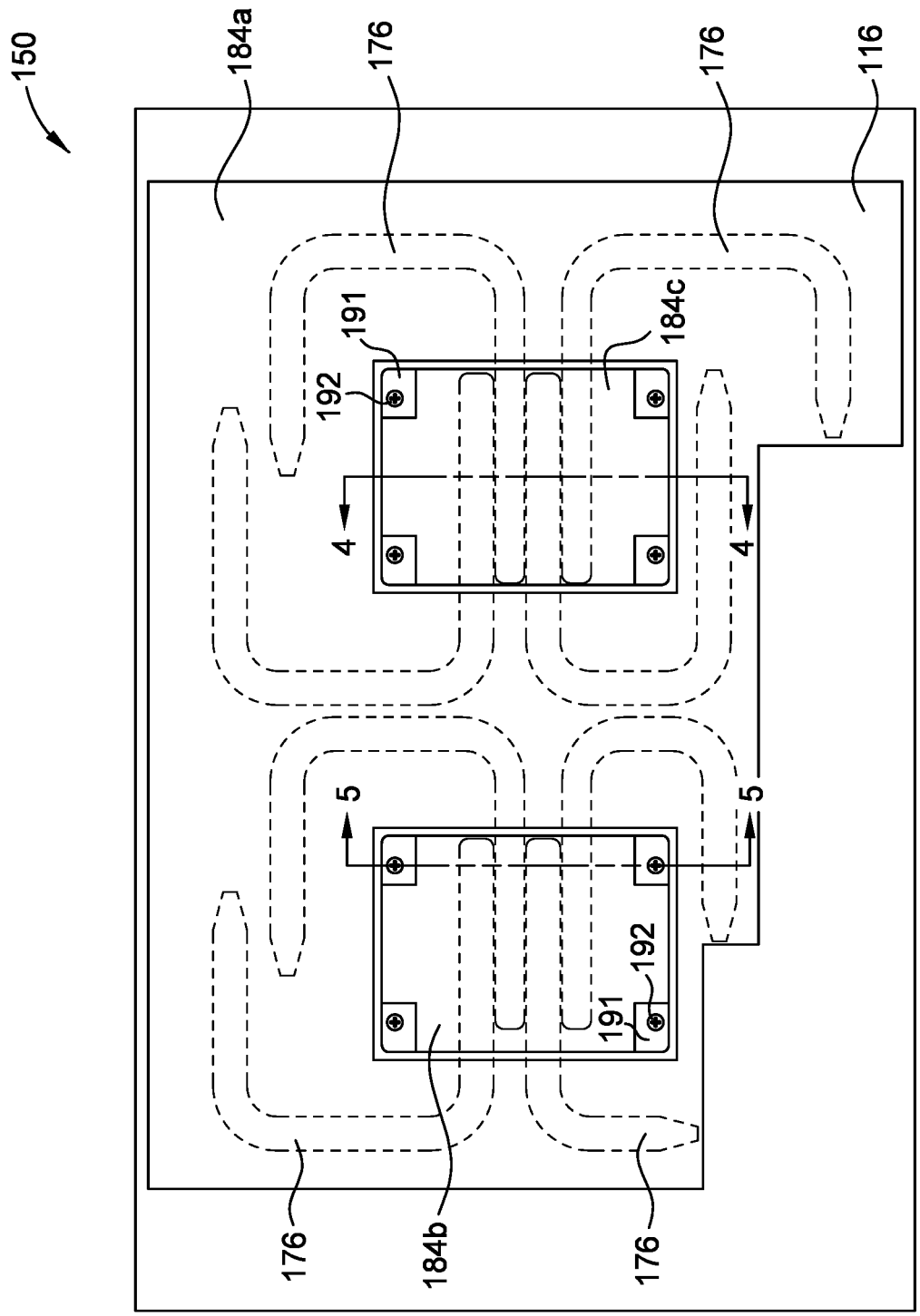
FIG. 3 is a top view of the micro device of FIG. 1.
Figure 4:
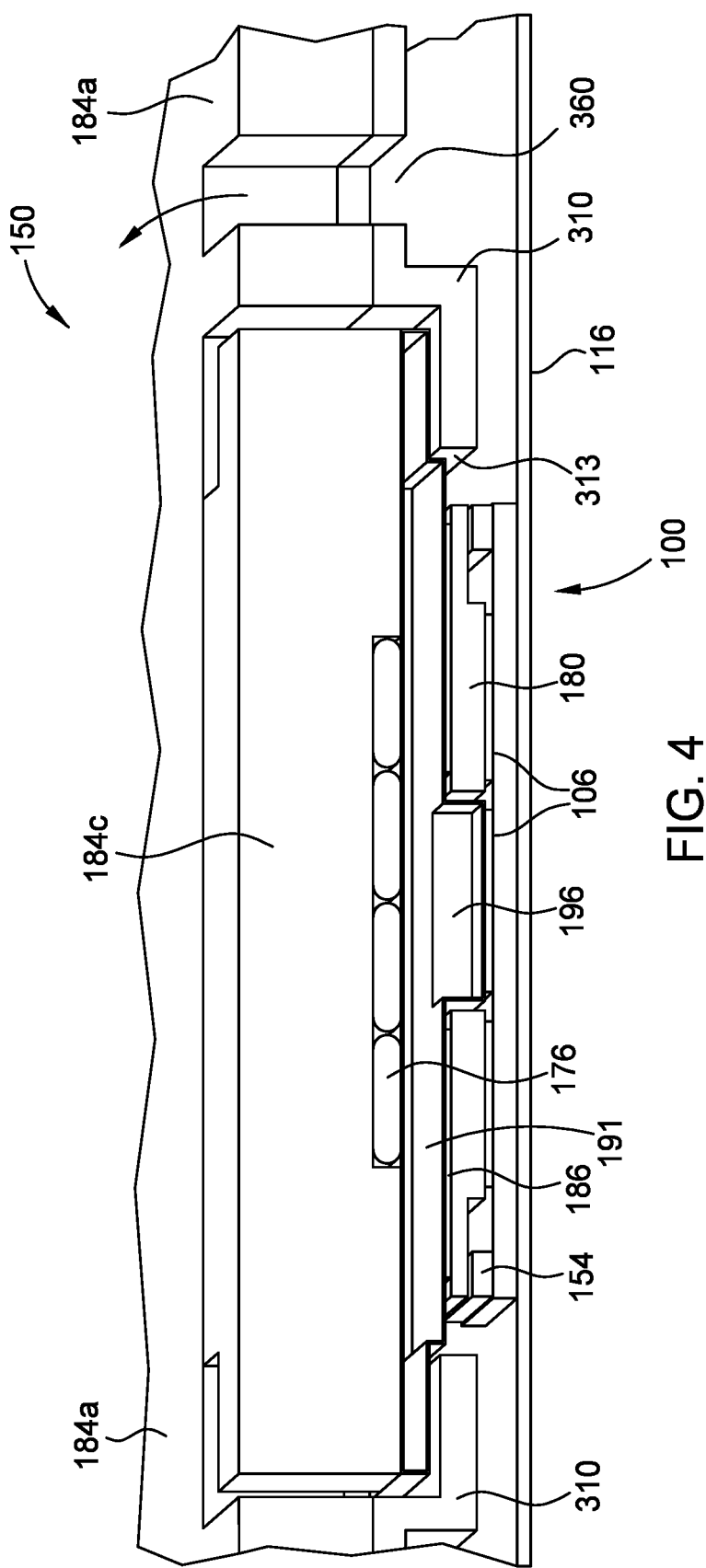
FIG. 4 is a partial cross-sectional view of the micro device of FIG. 1 taken along line 4-4 of FIG. 3.
Figure 5:
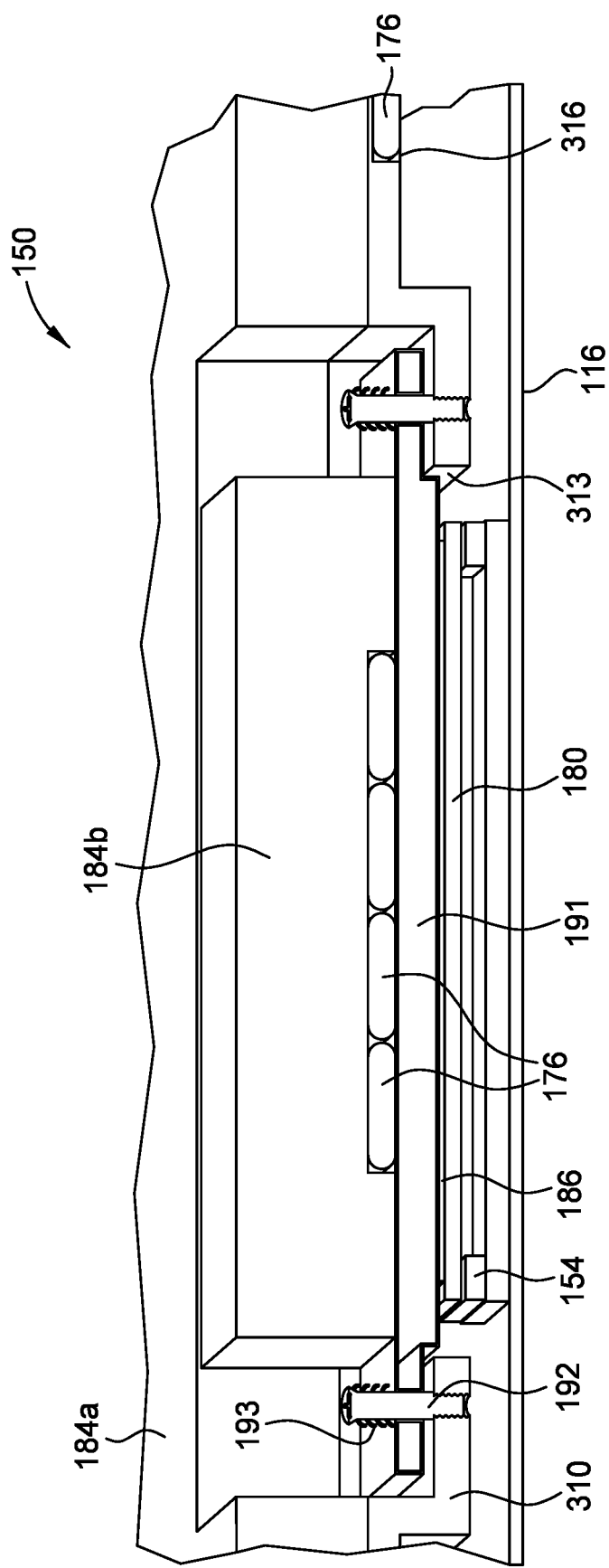
FIG. 5 is a partial cross-sectional view of the micro device of FIG. 1 taken along line 5-5 of FIG. 3.

Referring back to FIG. 1, the micro device 150 includes a lid 180 disposed over the IC dies 106 of the chip packages 100. The lid 180 may be the lid 280 disclosed in FIG. 2. Description of the micro device 150 will also be made with reference to FIGS. 3-5. FIG. 3 is a top view of the micro device 150. FIG. 4 is a partial cross-sectional view of the micro device 150 taken along line 4-4 of FIG. 3. FIG. 5 is a partial cross-sectional view of the micro device 150 taken along line 5-5 of FIG. 3. The lid 280 may be fabricated from a thermally conductive material, such as copper, nickel-plated copper, or aluminum, among other suitable materials. In some implementations, the lid 180 includes an opening 183 to allow another thermal management device 102 to contact the chip package 100, as will be described in more detail below.

A thermal interface material (TIM) 114 may be utilized to thermally and/or mechanically couple the lid 180 to the IC dies 106. The TIM 114 provides a thermally conductive path between the lid 180 to the IC dies 106 so that heat generated by the IC dies 106 may be dissipated through the lid 180. The TIM 114 may be the TIM 214 disclosed in FIG. 2. Examples of materials suitable for use as the TIM 114 include thermal grease, thermally conductive epoxy, phase-change materials (PCMs), conductive tapes, and silicone-coated fabrics among other suitable materials. In one example, the TIM 114 may be a phase-change material, such as Tpcm 780 or Tpcm 780SP available from Laird PLC of London, United Kingdom.

A frame 310 is attached to the PCB 116 and used to couple one or more thermal management devices 102 to the PCB 116. The frame 310 includes one or more apertures 313 to provide the thermal management devices 102 access to the chip packages 100. As shown, the frame 310 includes an aperture 313 for each chip package 100. The apertures 313 may be sufficiently sized to surround each chip package 100. In some implementations, the frame 310 may include an aperture 313 sufficiently sized to accommodate two or more chip packages 100. The frame 310 may include additional apertures corresponding to the number of additional chip packages 100. The frame 310 is fabricated from a thermally conductive material. For example, the frame 310 may be fabricated from a metal, such as aluminum, copper, titanium, or stainless steel, among others. The frame 310 may be attached to the PCB 116 using one or more fasteners 315. Exemplary fasteners 315 include bolts, screws, and pins. In this example, four fasteners 315 are used to attach the frame 310. However, any suitable number of fasteners, such as two, three, five, or more fasteners, may be used to attach the frame 310 to the PCB 116. The frame 310 may be sized to be disposed over (e.g., cover) a substantial portion of the PCB 116. In some embodiments, the frame 310 is sufficiently sized to cover from 60% to 95% or from 65% to 85% of the upper surface of the PCB 116.

One or more thermal management devices 102 may be coupled to the frame 310 to increase heat transfer away from the chip packages 100. The thermal management devices 102 generally include one or more optional active cooling devices 184 and one or more optional passive cooling devices. Exemplary passive cooling devices include heat pipe 176 and vapor chamber 191. Other examples of the passive cooling device include a solid state or thermoelectric cooling device, such as a Peltier cooler, or other suitable cooling device. Exemplary active cooling devices include fluid heat exchangers and thermoelectric heat pumps. Optionally, the passive cooling devices may be utilized with or without the active cooling device 184, and vice versa.

As mentioned above, the passive and active cooling devices are mounted in or on the frame 310. For example, the one or more passive cooling devices, e.g., heat pipe 176 and vapor chamber 191, may be soldered, adhered, brazed, clamped, fastened or otherwise affixed to the frame 310. In one example, a vapor chamber 191 is affixed to the frame 310 using a bolt 192, as shown in FIG. 5. In this example, four threaded bolts 192 are utilized to attach the vapor chamber 191 to the frame 310. In some implementations, the vapor chamber 191 is movable within the aperture 313 relative to the frame 310, such as movable in a direction normal to a plane of the frame 310. For example, an optional spring 193 disposed around the bolt 192 is used to bias the vapor chamber 191 against the frame 310 and allow the vapor chamber 191 to move relative to the frame 310. Because the each of vapor chamber 191 is separately attached to the frame 310, the biasing force applied to each vapor chamber 191 is independent to the biasing force applied to the other vapor chamber 191. In this respect, each of the vapor chambers 191 are independently movable relative to the frame 310 to accommodate any potential differences in the height or tolerances of the different chip packages 100.

As shown, eight fasteners (e.g., bolts 192) are used to attach two vapor chambers 191 to the frame 310, while four fasteners 315 are used to attach the frame 310 to the PCB 116. Advantageously, the number of fasteners used to secure the frame 310 is less than the total number of fasteners used to secure the plurality of thermal management devices 102, e.g., active cooling devices 184, heat pipe 176, and vapor chamber 191. Additional thermal management devices 102 may be added to the frame 310 to improve the heat management of the micro device 150 without increasing the number of fasteners attached to PCB 116.

The lower surface of the vapor chamber 191 may contact the upper surface of the lid 180 through the aperture 313 in the frame 310. In some implementations, an optional thermal pad 186 is disposed between the vapor chamber 191 and the lid 180. In one example, the thermal pad 186 is a silicone based thermally conductive gap filler, such as T-putty 607, which is available from Laird PLC. In some examples, the thermal pad 186 has an opening 187 that is at least partially aligned with the opening 183 of the lid 180.

The vapor chamber 191 may optionally include a lower portion 196 extending from the bottom surface thereof, as shown in FIG. 4. The lower portion 196 extends into the opening 183 of the lid 180 and the opening 187 of the thermal pad 186. The lower portion 196 may contact the upper surface of at least one of the IC dies 106 through the openings 183, 187. In some embodiments, a TIM 114 is disposed between the lower portion 196 and the IC dies 106, and the TIM 114 provides a thermal path therebetween. In some embodiments, the bottom surface of the vapor chamber 191, including the lower portion 196, may include diamonds and/or include a patterned surface. The patterned surface may be the patterned surface described above with respect to the lid 280.

The vapor chamber 191 includes a chamber in which a phase change material is disposed. In operation, the phase change material in liquid phase contacting the lower surface of the vapor chamber 191 absorbs heat from the lid 180 transferred from one of the IC dies 106 and turns into vapor. The vapor then travels within the chamber to a cooler portion of the vapor chamber 191, such as the upper surface of the vapor chamber 191. Contact with the cooler portion causes the vapor to condense back into a liquid, thereby releasing the latent heat into a heat pipe 176 and/or the active cooling device 184.

A plurality of heat pipes 176 are disposed on the vapor chamber 191 and the frame 310. In this example, four heat pipes 176 are provided for each chip package 100. As seen in FIG. 3, each of the heat pipes 176 (shown in dash lines) has a first portion disposed on the vapor chamber 191 and a second portion disposed on the frame 310, extending away from the vapor chamber 191. In some implementations, the second portion of the heat pipes 176 are disposed in a channel 316 formed in the upper surface of the frame 310. The second portions of the heat pipes 716 may have any suitable length and suitably spaced on the frame 310 to direct heat away from the vapor chamber 191. Exemplary heat pipe 176 may have a linear orientation, or have another orientation, such as U-shaped, L-shaped, J-shaped, "hockey stick-shaped" or other suitable shape. The plurality of heat pipes 176 may be soldered, adhered, brazed, clamped, fastened or otherwise affixed to the frame 310 and/or the vapor chamber 191. The heat pipes 176 have sufficient flexibility to allow the vapor chamber 191 to move relative to the frame 310.

The heat pipes 176 include a sealed tube in which a phase change material is disposed. In operation, the phase change material in a liquid phase contacting the first portion of the heat pipe 176 absorbs heat from the vapor chamber 191 and turns into vapor. The vapor then travels within the heat pipe 176 to the second portion, and condenses back into a liquid, thereby releasing the latent heat into the active cooling device 184 and/or the frame 310. The phase change material in liquid phase then returns to the first portion of the heat pipe, and the cycle repeats. Due to the very high heat transfer coefficients for vaporization and condensation, the heat pipe 176 is highly effective for conducting heat away from the IC dies 106 to locations of the frame 310 from which the heat may be more quickly and effectively removed from the micro device 150, which advantageously improves the heat transfer performance of the IC dies 106 and chip packages 100 of the micro device 150.

One or more active cooling devices 184 are mounted on the top surface of the frame 310, the heat pipes 176, and/or the vapor chamber 191. For example, the one or more active cooling devices 184 may be soldered, adhered, brazed, clamped, fastened or otherwise affixed in good thermal contact with these top surfaces. As shown, a first active cooling device 184a is affixed on the top surface of the frame 310, for example, affixed by soldering or brazing. The first active cooling device 184a has a shape that substantially corresponds to the shape of the frame 310, although the first active cooling device 184a may be smaller or larger than the frame 310. The second portions of the heat pipes 176 may be disposed between the first active cooling device 184a and the frame 310. In this example, the first active cooling device 184a includes openings 189 that correspond to the apertures 313 of the frame 310.

A second active cooling device 184b and a third active cooling device 184c are attached to a top surface of a respective vapor chamber 191 and heat pipes 176. The second and third cooling devices 184b, 184c are sized to fit within the openings 189 of the first active cooling device 184a and are movable with the vapor chambers 191. The first portions of the heat pipes 176 may be disposed between the second and third active cooling devices 184b, 184c and the vapor chamber 191. In one example, the second and third cooling devices 184b, 184c are soldered or brazed to the vapor chamber 191. The heat pipes 176 may bend to allow the second and third active cooling devices 184b, 184c to move with the vapor chamber 191. In some embodiments, the second and third active cooling devices 184b, 184c are attached to the frame 310 without utilizing the vapor chamber 191. In some embodiments, the vapor chamber 191 may be formed as the bottom surface of the second and third active cooling devices 184b, 184c.

The active cooling device 184 generally contain ports for circulating working heat transfer fluids, such as coolant, through the active cooling devices 184. Thus, the passive cooling devices such as heat pipes 176 generally route heat to different portions of the frame 310, while the active cooling devices 184 removes routed heat and ultimately, the chip package 100 and micro device 150. Accordingly, the thermal management device 102 effectively removes heat from the chip packages 100 utilizing predetermined placement of the cooling devices, e.g., active cooling devices 184, heat pipe 176, and vapor chamber 191, relative to location of the heat sources (i.e., IC dies 106) within the chip packages 100.

The active cooling devices 184a, 184b, 184c generally includes a body having a hollow interior through which passages are routed between an inlet port and an outlet port. The passages may additionally include plurality of fins to increase the surface area for heat transfer. In some embodiments, the fins of the active cooling devices 184a, 184b, 184c are directionally aligned in a common direction. A heat transfer fluid is flowed through passages to remove heat from the surrounding surfaces. In some implementations, one or more of the first, second, and third active cooling devices 184a, 184b, 184c may be fluidly connected. For example, a working heat transfer fluid from the first active cooling device 184a may circulated to the inlet ports of the second and third active cooling devices 184b, 184c, and the outlet ports of the second and third active cooling devices 184b, 184c may be circulated back to the first active cooling device 184a.

In one example, the body of the second and third active cooling devices 184b, 184c are located directly above the vapor chambers 191, as seen in FIGS. 4 and 5. The body of the active cooling devices 184a, 184b, 184c is fabricated from a highly thermally conductive material that is compatible with the heat transfer fluid. In one example, the bodies are generally fabricated from copper.

In some embodiments, a flow channel is formed through an active cooling device to allow a fluid, such as air, around a chip package to flow out of the electronic device. For example, FIG. 4 illustrates a flow channel 360 formed through the first active cooling device 184a. The flow channel 360 provide fluid communication between area below the first active cooling device 184a and the exterior of the first active cooling device 184a. In this example, the flow channel 360 allows air from below the first active cooling device 184a and surrounding the chip package 100 to flow through the first active cooling device 184a and out of the micro device 150. In this example, the flow channel 360 also extends through the frame 310 supporting the first active cooling device 184a. Air flowing out of the micro device 150 may advantageously carry any contaminants such as dust out of the micro device 150 and assist with reducing the temperature of the chip package 100. Although only one flow channel 360 is shown, it is contemplated a plurality of flow channels 360 may be formed through the first active cooling device 184a or other cooling devices, such as the second and third active cooling devices 184b, 184c. The flow channels 360 may have any suitable shape for fluid flow, including circular, oval, or polygonal, such as rectangular.

Figure 6:
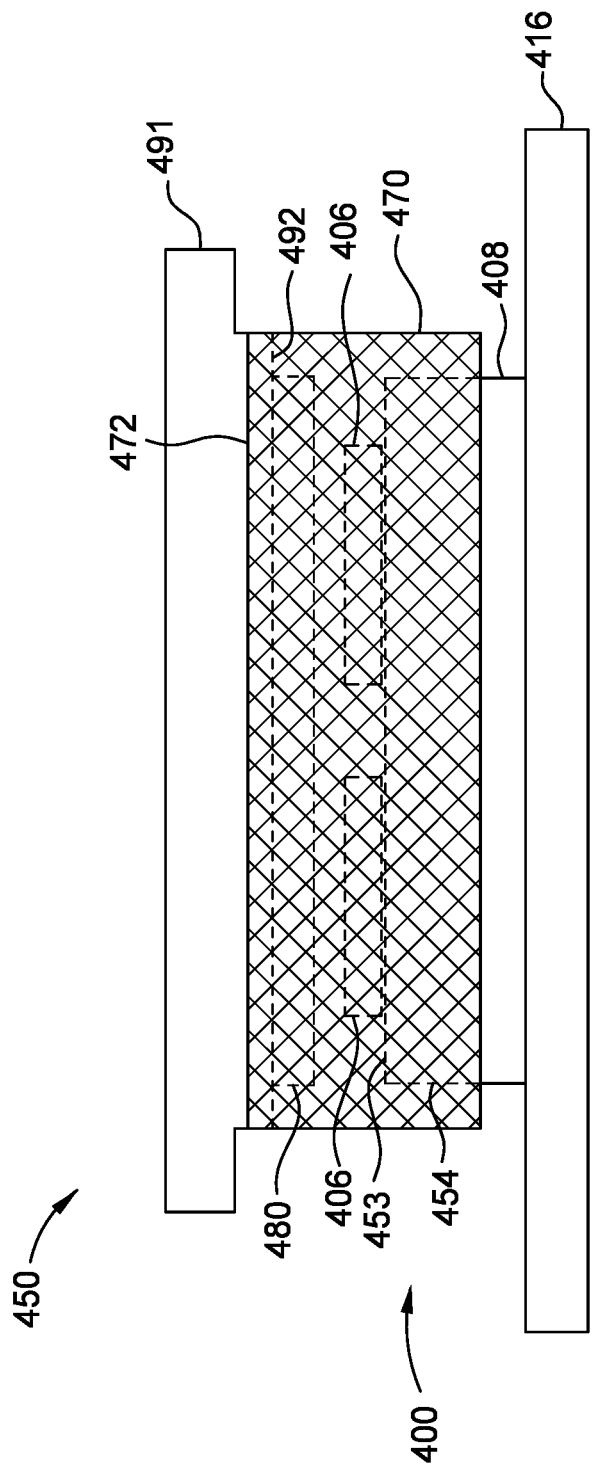
FIG. 6 is a schematic view of a micro device having a screen, according to some embodiments.

In some embodiments, as shown in FIG. 6, a micro device 450 may be equipped with an optional screen 470 to protect the chip package 400 from contaminants such as dust. The micro device 450 may be the micro device 150 shown in FIG. 1, and the chip package 400 may be chip packages 100, 200 shown in FIGS. 1 and 2. For sake of clarity, components in FIG. 6 having the same reference as in FIGS. 1 and 2 are similar, and some of device components, such as the frame 310, interposer 207, TIM 214, and solder connections 218, 222, are not shown. In FIG. 6, the chip package 400 includes two IC dies 406 and a stiffener 454. The IC dies 406 and the stiffener 454 are disposed on a package substrate 408, which is disposed on a PCB 416. The IC dies 406 are shown rising above the top of the stiffener 454. A lid 480 is disposed above the IC dies 406. A thermal interface material may be utilized to couple the lid 480 to the IC dies 406.

One or more thermal management devices may be disposed on the lid 480. In this example, a vapor chamber 491 is disposed on the lid 480. Alternatively or in addition to, one or more thermal management devices, such as an active cooling device or passive cooling device, may be used. For example, similar to FIG. 4, an active cooling device having fins and heat pipes may be disposed on the vapor chamber 491. As shown, an upper end 472 of the screen 470 is attached to the side of the vapor chamber 491. The upper end 472 of the screen 470 is located above the lower end 492 of the vapor chamber 491. The screen 470 extends downward and has a length that extends at least partially below the upper end 453 of the stiffener 454. For example, the screen 470 can extend down to the package substrate 408 or just above PCB 416. The screen 470 may be disposed around the perimeter of the stiffener 454. In some embodiments, the screen 470 is made of a polymeric material or other suitable electrically non-conductive material. The screen 470 has a porosity that is sufficient to block contaminants such as dust from passing through the screen 470. For example, the screen 470 is sized to block particles that are at least 1 micron in diameter or at least 3 microns in diameter.

Figure 7:
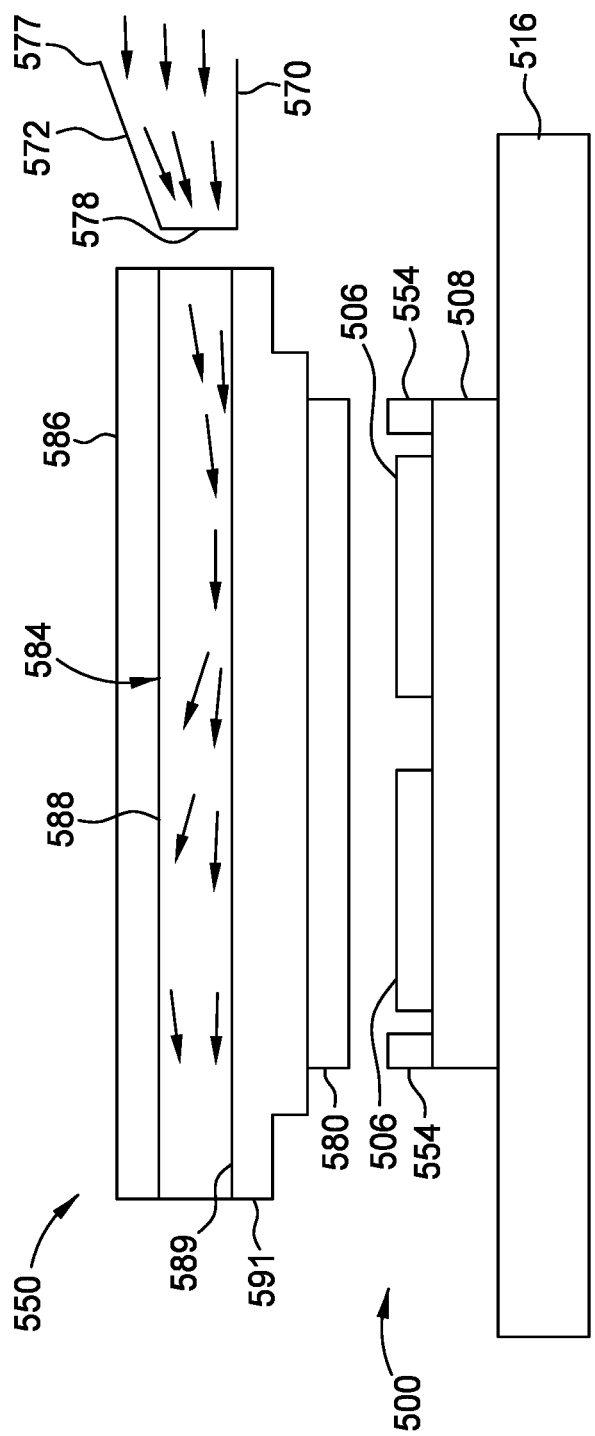
FIG. 7 is a schematic view of a micro device coupled to a flow diverter, according to some embodiments.

FIG. 7 shows a micro device 550 provided with a flow diverter 570 to direct the flow of fluid toward the fins 588 of an active cooling device 584, according to some embodiments. The micro device 550 may be the micro device 150 shown in FIG. 1, and the chip package 500 may be chip packages 100, 200 shown in FIGS. 1 and 2. For sake of clarity, components in FIG. 7 having the same reference as in FIGS. 1 and 2 are similar, and some of device components, such as the frame 310, interposer 207, TIM 214, and solder connections 218, 222, are not shown. In FIG. 7, the chip package 500 includes two IC dies 506 and a stiffener 554. The IC dies 506 and the stiffener 554 are disposed on a package substrate 508, which is disposed on a PCB 516. A lid 580 is disposed above the IC dies 506. A thermal interface material may be utilized to couple the lid 580 to the IC dies 506.

One or more thermal management devices may be disposed on the lid 580. In this example, a vapor chamber 591 is disposed on the lid 580. An active cooling device 584 having a plurality of fins 588 is disposed on the vapor chamber 591. In some embodiments, the vapor chamber 591 is optional or is integrated with the active cooling device 584. In some embodiments, a passive cooling device, such as heat pipes, may be used.

As shown, a flow diverter 570 is provided to direct the flow of fluid toward the fins 588 of the active cooling device 584. The fluid may be a compressible fluid or a non-compressible fluid. In some embodiments, the fluid can be electrically conductive or electrically non-conductive. In one example, the fluid is air. The flow diverter 570 may be a conduit having a first opening 577 for receiving fluid from a fluid source and a second opening 578 for directing the fluid to the fins 588. In some embodiments, the flow diverter 570 includes a deflecting surface 572 for directing the fluid downward towards a bottom surface 589 of the active cooling device 584. The deflecting surface 572 may have an angle from 1 degree to 90 degrees, 1 degree to 80 degrees, 5 degrees to 75 degrees, or 15 degrees to 60 degrees relative to the bottom surface 589 of the fins 588. In some embodiments, the deflecting surface 572 has an angle that is sufficient to create turbulent flow through the fins 588. In some embodiments, the flow diverter 570 is attachable to the active cooling device 584 or to the fluid source, such as a fan. In some embodiments, an optional shroud 586 is disposed on top of the fins 588 if the fins 588 are open at the top. The shroud 586 may cover at least a portion of the longitudinal length of the fins 588. In one example, the shroud 586 covers from 50% to 100% or 50% to 90% of the length of the fins 588. The shroud 586 may be made from a conductive or non-conductive material.

Figure 8:
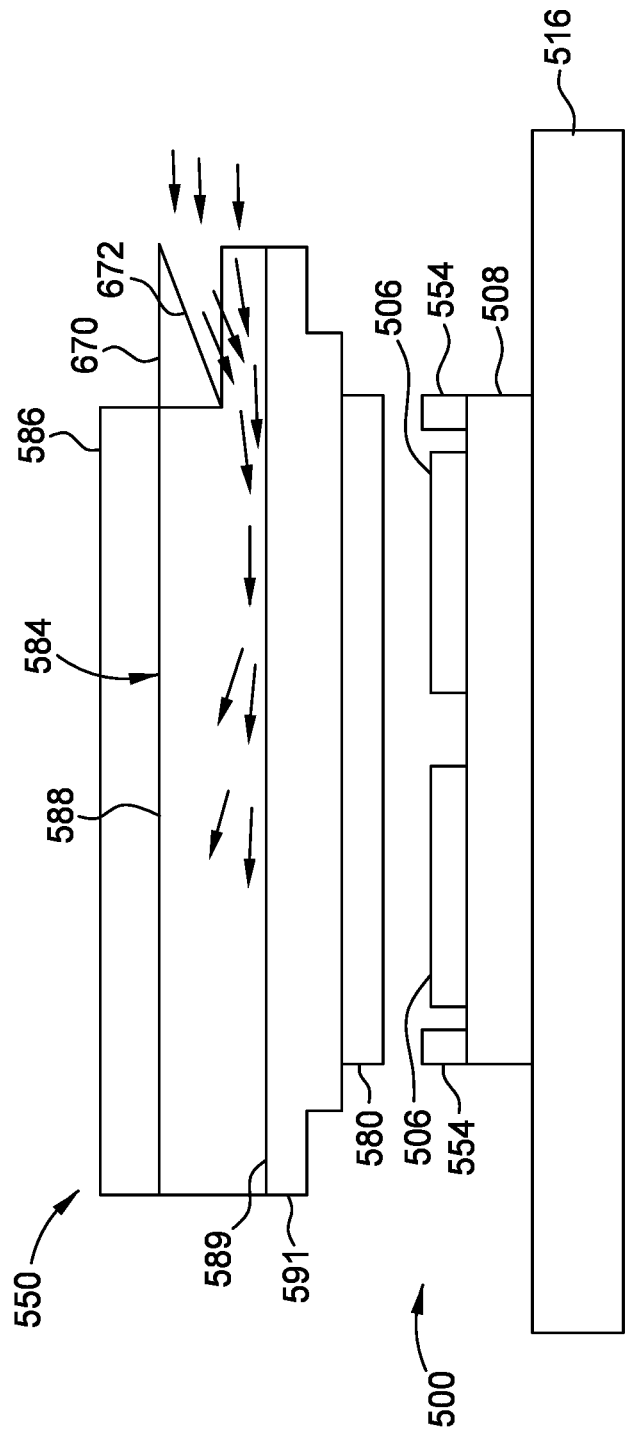
FIG. 8 is a schematic view of another micro device coupled to a flow diverter, according to some embodiments.

FIG. 8 shows the micro device 550 provided with another example of a flow diverter 670 to direct the flow of fluid toward the fins 588 of an active cooling device 584, according to some embodiments. In this embodiment, the flow diverter 670 is positioned on the fins 588 of the active cooling device 584 and near the end of the fins 588 receiving the incoming fluid. As shown, the flow diverter 670 is disposed on a recessed section of the fins 588. Although the top of the flow diverter 670 is shown aligned with the top of the fins 588, it is contemplated the top of the flow diverter 670 may be higher or lower than the top of the fins 588. In some embodiments, the top of flow diverter 670 is higher to ensure all of the incoming fluid is directed toward the fins 588. In some embodiments, the fins 588 are not recessed, and the flow diverter 670 is attached at the longitudinal end of the fins 588. The fluid may be a compressible fluid or non-compressible fluid. In some embodiments, the fluid is air.

The flow diverter 670 includes a deflecting surface 672 for directing the incoming fluid downward toward a bottom surface 589 of the active cooling device 584. The deflecting surface 672 may have an angle from 1 degree to 90 degrees, 1 degree to 80 degrees, 5 degrees to 75 degrees, or 15 degrees to 60 degrees relative to the top surface of the flow diverter 670. In some embodiments, the deflecting surface 672 has an angle that is sufficient to create turbulent flow through the fins 588. In some embodiments, an optional shroud 586 is disposed on top of the fins 588 if the fins 588 are open at the top. The shroud 586 may cover at least a portion of the length of the fins 588 and the flow diverter 670. In one example, the shroud covers from 50% to 100% or 50% to 90% of the length of the fins 588. In this example, the shroud 586 is not disposed on top of the flow diverter 670. The shroud 586 may be made from a conductive or non-conductive material.

Figure 9:
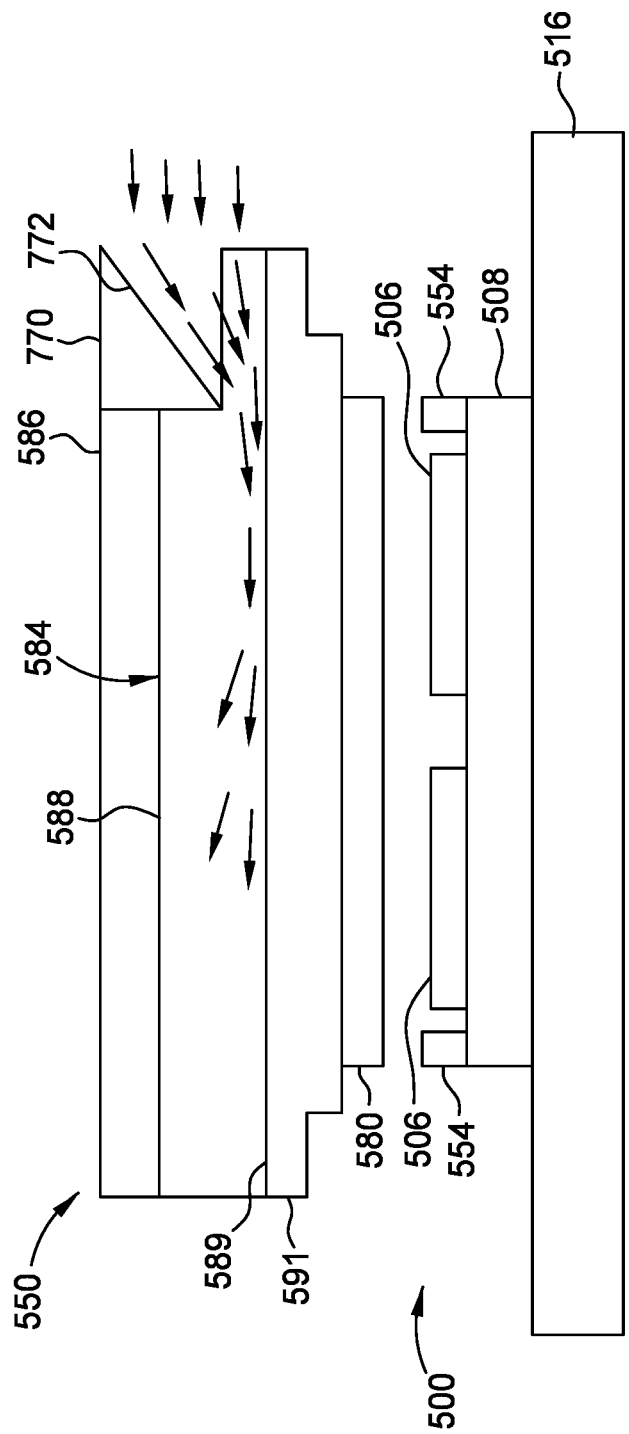
FIG. 9 is a schematic view of another micro device coupled to a flow diverter, according to some embodiments.

FIG. 9 shows the micro device 550 provided with another example of a flow diverter 770 to direct the flow of fluid toward the fins 588 of an active cooling device 584, according to some embodiments. In this embodiment, the flow diverter 770 is positioned on the fins 588 of the active cooling device 584 and near the end of the fins 588 receiving the incoming fluid. As shown, the flow diverter 770 is disposed on a recessed section of the fins 588. The top of the flow diverter 770 is shown aligned with the top of the shroud 586. It is contemplated the top of the flow diverter 770 may be higher or lower than the top of the shroud 586. In some embodiments, the flow diverter 770 is integrated with the shroud 586. The fluid may be a compressible fluid or non-compressible fluid. In some embodiments, the fluid is air.

The flow diverter 770 includes a deflecting surface 772 for directing the incoming fluid downward toward a bottom surface 589 of the active cooling device 584. The deflecting surface 772 may have an angle from 1 degree to 90 degrees, 1 degree to 80 degrees, 5 degrees to 75 degrees, or 15 degrees to 60 degrees relative to the top surface of the flow diverter 770. In some embodiments, the deflecting surface 772 has an angle that is sufficient to create turbulent flow through the fins 588.

Figure 10:
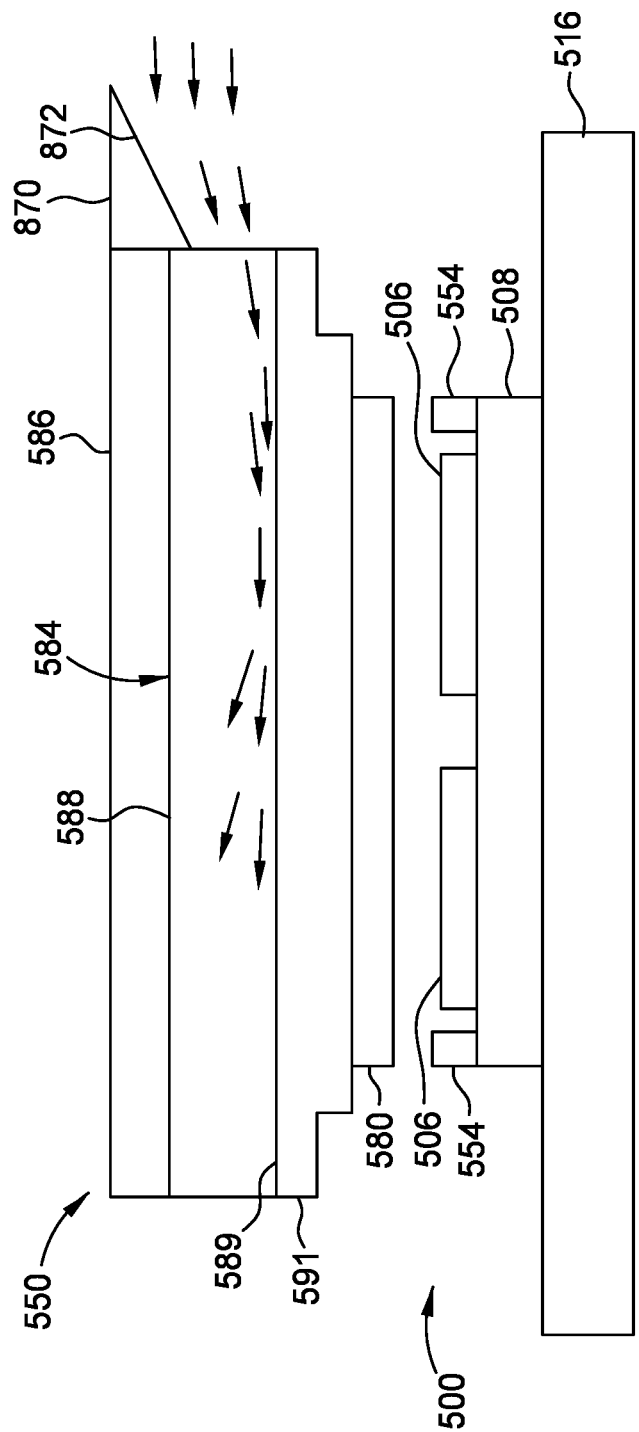
FIG. 10 is a schematic view of another micro device coupled to a flow diverter, according to some embodiments.

FIG. 10 shows the micro device 550 provided with another example of a flow diverter 870 to direct the flow of fluid toward the fins 588 of an active cooling device 584, according to some embodiments. As shown, a shroud 586 is disposed on top of the fins 588. The shroud 586 covers at least a portion of the length of the fins 588. In one example, the shroud covers from 50% to 100% or 50% to 90% of the length of the fins 588. The shroud 586 may be made from a conductive or non-conductive material.

In this embodiment, the flow diverter 870 is positioned at the inlet end of the fins 588 of the active cooling device 584. The flow diverter 870 may be attached to the end of the shroud 586 and/or the fins 588. In some embodiments, the flow diverter 870 is integrated with the shroud 586. The top of the flow diverter 870 is shown aligned with the top of the shroud 586. It is contemplated the top of the flow diverter 870 may be higher or lower than the top of the shroud 586. The fluid may be a compressible fluid or non-compressible fluid. In some embodiments, the fluid is air.

The flow diverter 870 includes a deflecting surface 872 for directing the incoming fluid downward toward a bottom surface 589 of the active cooling device 584. The deflecting surface 872 may have an angle from 1 degree to 90 degrees, 1 degree to 80 degrees, 5 degrees to 75 degrees, or 15 degrees to 60 degrees relative to the top surface of the flow diverter 870. In some embodiments, the deflecting surface 872 has an angle that is sufficient to create turbulent flow through the fins 588. The bottom of the deflecting surface 872 may be aligned with the top of the fins 588 or below the fins 588, depending on the angle of deflection.

In one example, an electronic device having a frame for coupling a plurality of thermal management devices to the printed circuit board is provided. The electronic device includes a first chip package mounted to the PCB and a second chip package mounted to the PCB. The frame is secured to the PCB, and the frame has a first aperture disposed over the first chip package and a second aperture disposed over the second chip package. The plurality of thermal management devices coupled to the frame includes a first thermal management device contacting an IC die of the first chip package through the first aperture and a second thermal management device contacting an IC die of the second chip package through the second aperture.

In some embodiments, the first thermal management device is biased against the first chip package using a first force independent of a second force biasing the second thermal management device against the second chip package.

In some embodiments, a number of fasteners securing the frame to the PCB is less than a number of fasteners securing the plurality of thermal management devices to the frame.

In some embodiments, the first thermal management device is movable within the first aperture in a direction normal to a plane of the frame.

In some embodiments, the first thermal management device comprises a first vapor chamber.

In some embodiments, the device includes a first lid disposed between the first vapor chamber and the first chip package.

In some embodiments, the device includes a heat pipe in contact with the first thermal management device and the frame.

In some embodiments, the heat pipe is configured to allow the first thermal management device to move relative to the frame.

In some embodiments, the heat pipe includes a first portion disposed on the first thermal management device and a second portion disposed on the frame.

In some embodiments, the first portion of the heat pipe is disposed between the first thermal management device and a third thermal management device having fins, the third thermal management device movable with the first thermal management device.

In some embodiments, the second portion of the heat pipe is disposed between the frame and a fourth thermal management device having fins, the fourth thermal management device attached to the frame.

In some embodiments, the fins of the third thermal management device are directionally aligned with the fins of the fourth thermal management device.

In some embodiments, the third thermal management device comprises an active cooling device employing a working heat transfer fluid.

In some embodiments, the first thermal management device has a bottom surface facing a top surface of the IC die of the first chip package, the bottom surface having one or more of diamond or grooves.

In some embodiments, the frame includes a third aperture disposed over a third chip package.

In another example, an electronic device having a frame for coupling a plurality of thermal management devices to the printed circuit board is provided. The electronic device includes a first chip package mounted to the PCB and a second chip package mounted to the PCB. The frame is secured to the PCB, and the frame has a first aperture and a second aperture. The plurality of thermal management devices coupled to the frame includes a first thermal management device in thermal contact with an IC die of the first chip package through the first aperture, a second thermal management device in thermal contact with an IC die of the second chip package through the second aperture, and a third thermal management device having a first opening and a second opening aligned with the first aperture and the second aperture, respectively.

In some embodiments, the first thermal management device and the second thermal management device are independently movable relative to the frame.

In some embodiments, a number of fasteners securing the frame to the PCB is less than a number of fasteners securing the plurality of thermal management devices to the frame.

In some embodiments, the first thermal management device comprises a first vapor chamber.

In some embodiments, the device includes a first lid disposed between the first vapor chamber and the first chip package.

In some embodiments, the device includes a heat pipe in contact with the first thermal management device and the frame.

In some embodiments, the heat pipe is configured to allow the first thermal management device to move relative to the frame.

In some embodiments, the heat pipe includes a first portion disposed on the first thermal management device and a second portion disposed on the frame.

In some embodiments, the second portion of the heat pipe is disposed between the frame and the third thermal management device, the third thermal management device having fins.

In some embodiments, the device includes a flow channel formed through the third thermal management device and the frame.

In some embodiments, the device includes a screen attached to the first thermal management device, the second thermal management device, or both.

In some embodiments, the device includes a stiffener, wherein the screen is disposed around the stiffener.

In some embodiments, the third thermal management device includes fins, and further comprising a flow diverter for directing fluid flow toward a bottom surface of the fins.

In some embodiments, the flow diverter is disposed on a recessed section of the fins.

In some embodiments, the flow diverter is coupled to a longitudinal end of the fins.

In some embodiments, the device includes a shroud disposed on top of the fins.

In some embodiments, the flow diverter is integrated with the shroud.

While the foregoing is directed to embodiments of the present invention, other and further embodiments of the invention may be devised without departing from the basic scope thereof, and the scope thereof is determined by the claims that follow.

What is claimed is:

1. An electronic device, comprising:
   a printed circuit board (PCB);
   a first chip package mounted to the PCB;
   a second chip package mounted to the PCB;
   a frame secured to the PCB, the frame having a first aperture disposed over the first chip package and a second aperture disposed over the second chip package; and
   a plurality of thermal management devices coupled to the frame, the plurality of thermal management devices having a first thermal management device contacting an integrated circuit (IC) die of the first chip package through the first aperture, and a second thermal management device contacting an IC die of the second chip package through the second aperture.

2. The electronic device of claim 1, wherein the first thermal management device is biased against the first chip package using a first force independent of a second force biasing the second thermal management device against the second chip package.

3. The electronic device of claim 1, wherein a number of fasteners securing the frame to the PCB is less than a number of fasteners securing the plurality of thermal management devices to the frame.

4. The electronic device of claim 1, wherein the first thermal management device is movable within the first aperture in a direction normal to a plane of the frame.

5. The electronic device of claim 1, wherein the first thermal management device comprises a first vapor chamber.

6. The electronic device of claim 5, further comprising a first lid disposed between the first vapor chamber and the first chip package.

7. The electronic device of claim 1, further comprising a heat pipe in contact with the first thermal management device and the frame.

8. The electronic device of claim 7, wherein the heat pipe is configured to allow the first thermal management device to move relative to the frame.

9. The electronic device of claim 7, wherein the heat pipe includes a first portion disposed on the first thermal management device and a second portion disposed on the frame.

10. The electronic device of claim 9, wherein the first portion of the heat pipe is disposed between the first thermal management device and a third thermal management device having fins, the third thermal management device movable with the first thermal management device.

11. The electronic device of claim 10, wherein the second portion of the heat pipe is disposed between the frame and a fourth thermal management device having fins, the fourth thermal management device attached to the frame.

12. The electronic device of claim 11, wherein the fins of the third thermal management device are directionally aligned with the fins of the fourth thermal management device.

13. An electronic device, comprising:
    a printed circuit board (PCB);
    a first chip package mounted to the PCB;
    a second chip package mounted to the PCB;
    a frame secured to the PCB, the frame having a first aperture and a second aperture; and
    a plurality of thermal management devices coupled to the frame, the plurality of thermal management devices having:
      a first thermal management device in thermal contact with an IC die of the first chip package through the first aperture;
      a second thermal management device in thermal contact with an IC die of the second chip package through the second aperture; and
      a third thermal management device having a first opening and a second opening aligned with the first aperture and the second aperture, respectively.

14. The electronic device of claim 13, wherein the first thermal management device and the second thermal management device are independently movable relative to the frame.

15. The electronic device of claim 13, wherein a number of fasteners securing the frame to the PCB is less than a number of fasteners securing the plurality of thermal management devices to the frame.

16. The electronic device of claim 13, further comprising a flow channel formed through the third thermal management device and the frame.

17. The electronic device of claim 13, further comprising a screen attached to the first thermal management device, the second thermal management device, or both.

18. The electronic device of claim 17, further comprising a stiffener, wherein the screen is disposed around the stiffener.

19. The electronic device of claim 13, wherein the third thermal management device includes fins, and further comprising a flow diverter for directing fluid flow toward a bottom surface of the fins.

20. The electronic device of claim 19, wherein at least one of:
    a. the flow diverter is disposed on a recessed section of the fins;
    b. the flow diverter is coupled to a longitudinal end of the fins; or
    c. the device includes a shroud disposed on top of the fins.

* * * * *